United States Patent
Pietri et al.

(10) Patent No.: US 8,164,378 B2
(45) Date of Patent: Apr. 24, 2012

(54) DEVICE AND TECHNIQUE FOR TRANSISTOR WELL BIASING

(75) Inventors: Stefano Pietri, Austin, TX (US);
Alfredo Olmos, Austin, TX (US);
Jehoda Refaeli, Austin, TX (US);
Jefferson Daniel de Barros Soldera, Campinas (BR)

(73) Assignee: Freescale Semiconductor, Inc., Austin, TX (US)

( * ) Notice: Subject to any disclaimer, the term of this patent is extended or adjusted under 35 U.S.C. 154(b) by 265 days.

(21) Appl. No.: 12/115,825

(22) Filed: May 6, 2008

(65) Prior Publication Data
US 2009/0278571 A1 Nov. 12, 2009

(51) Int. Cl.
*H03K 3/01* (2006.01)
*H03K 17/00* (2006.01)
(52) U.S. Cl. ......... 327/534; 327/407; 327/408; 327/537
(58) Field of Classification Search .......... 327/530, 327/534–538, 540, 541, 407, 408
See application file for complete search history.

(56) References Cited

U.S. PATENT DOCUMENTS

| | | | |
|---|---|---|---|
| 5,675,480 A | 10/1997 | Stanford | |
| 5,748,033 A | 5/1998 | Kaveh et al. | |
| 6,040,718 A | 3/2000 | Henry | |
| 6,121,786 A | 9/2000 | Yamagami et al. | |
| 6,172,884 B1 | 1/2001 | Lanni | |
| 6,265,855 B1 | 7/2001 | Aas et al. | |
| 6,469,568 B2 * | 10/2002 | Toyoyama et al. | 327/534 |
| 6,472,898 B1 | 10/2002 | Hollmer et al. | |
| 6,538,867 B1 * | 3/2003 | Goodell et al. | 361/91.1 |
| 6,566,935 B1 | 5/2003 | Renous | |
| 6,720,896 B2 | 4/2004 | Semmler et al. | |
| 6,737,838 B2 | 5/2004 | Sluijs et al. | |
| 6,819,088 B2 | 11/2004 | Shenai et al. | |
| 6,847,249 B1 * | 1/2005 | Brokaw | 327/408 |
| 6,995,599 B2 | 2/2006 | Huang et al. | |

(Continued)

FOREIGN PATENT DOCUMENTS

EP 1081572 A1 3/2001

(Continued)

OTHER PUBLICATIONS

Hong et al., "A reverse voltage protection circuit for MOSFET power switches," IEEE JSSC, vol. 36, No. 1, Jan. 2001, p. 152-155.

(Continued)

*Primary Examiner* — Lincoln Donovan
*Assistant Examiner* — Colleen O Toole

(57) ABSTRACT

A method includes receiving a set of voltages comprising at least a first voltage, a second voltage, and a third voltage and biasing a well of a transistor based on the extreme voltage of the set of voltages. Biasing the well of the transistor can include concurrently providing a first signal and a second signal based on a comparison of the first voltage and the second voltage and selectively coupling the well of the transistor to a source of the extreme voltage of the set of voltages based on the first signal, the second signal, and the third voltage. An electronic device comprises a transistor and a power switching module. The power switching module includes a set of inputs, each input configured to receive a corresponding one of a set of voltages comprising at least a first voltage, a second voltage, and a third voltage, and includes an output coupled to a well of the transistor, the output configured to provide the extreme voltage of the set of voltages.

1 Claim, 3 Drawing Sheets

U.S. PATENT DOCUMENTS

| | | | |
|---|---|---|---|
| 7,206,208 | B1 | 4/2007 | Hsu et al. |
| 7,514,983 | B2 * | 4/2009 | Miske .......................... 327/534 |
| 7,538,602 | B2 * | 5/2009 | Takeuchi ..................... 327/543 |
| 7,608,942 | B2 | 10/2009 | Chun et al. |
| 7,675,317 | B2 * | 3/2010 | Perisetty ......................... 326/38 |

FOREIGN PATENT DOCUMENTS

| | | |
|---|---|---|
| GB | 2293290 A | 3/1996 |
| JP | 06139373 | 5/1994 |
| JP | 2001284530 | 12/2001 |
| JP | 2002111470 | 4/2002 |

OTHER PUBLICATIONS

Sakamoto et al., "A three terminal intelligent power MOSFET with built-in reverse battery protection for automotive applications," IEEE Trans on Electron Devices, vol. 46, No. 11, Nov. 1999, p. 2228-2234.

Ueda et al., "A 3.3V ASIC for mixed voltage applications with shut down mode," IEEE Custom Integrated Circuits Conf., May 1993, p. 25.5.1-25.5.4.

Ali et al, "A Fast Response, Programmable PA Regulator Subsystem for Dual Mode CDMA/AMPS Handsets," Radio Frequency Integrated Circuits Symposium, 2000 IEEE, 2000, pp. 231-234.

* cited by examiner

US 8,164,378 B2

DEVICE AND TECHNIQUE FOR TRANSISTOR WELL BIASING

FIELD OF THE DISCLOSURE

The present disclosure relates generally to transistor-based circuitry and more particularly to biasing wells of transistors.

BACKGROUND

For complementary metal oxide semiconductor (CMOS) and similar transistor architectures, a transistor can be modeled as a five terminal component whereby the current flow through the transistor is controlled by the relative voltage potentials at its five terminals: source, gate, drain, body or well, and substrate. In normal operating conditions, in order to prevent currents from flowing in, for example, a p-type transistor, the gate terminal is biased at a voltage Vg higher than both the source voltage Vs and the drain voltage Vd and less than a threshold voltage Vtp (e.g., Vg>max(Vs, Vd)+Vtp). At the same time the intrinsic junction diodes at the source to body junction, the drain to body junction, and the substrate to body junction are kept reverse biased. However, the magnitudes of the voltages applicable to the electrodes of a transistor may vary with respect to each other in a non-determinate or non-ordered manner, such as during the power-down or power-up sequence of the device in which the transistor is implemented. In such circumstances, it can be undesirable to fixedly connect the well of a transistor to a particular electrode of the transistor so that the well and the electrode are always biased by the same voltage because that voltage may not be the highest voltage applied to the electrodes of the transistor when attempting to render the transistor non-conductive. If the gate is not biased to the highest voltage at the source—drain electrodes of the transistor (for a p-type transistor), the transistor typically may remain conductive through the channel. If the well is not biased at a voltage higher than the voltage potentials at the source, drain and substrate, reverse currents may be injected possibly leading to undesired circuit behavior, including latch-up.

To prevent the possibility of reverse currents and relative effects, biasing circuits have been developed to allow one of two voltages to be used as a well biasing voltage. However, these circuits typically are not scalable to accommodate selection between more than two voltages. Further, the selection between the two available voltages typically is enacted in response to control signals that are generated based on "a priori" knowledge of which voltage will be the highest (or, alternately, lowest) of the two voltages at any given time. As such, their reliance on a determinate relationship between the two selectable voltages are of limited or no use in contexts whereby the voltages may be fluctuating unpredictably with respect to each other or whereby the highest (or lowest) of three or more voltages is to be used in biasing the wells of transistors so as to render them non-conductive. Accordingly, an improved technique for biasing a well of a transistor would be advantageous.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

FIGS. 1-7 illustrate example techniques for biasing the wells of one or more transistors using the extreme voltage of a set of three or more voltages in accordance with at least one embodiment of the present disclosure. As used herein, the extreme voltage of a set of voltages is defined as the maximum voltage of the set of voltages in the context of biasing the N-well of a p-type transistor or is defined as the minimum voltage of the set of voltages in the context of biasing the P-well of an n-type transistor. For ease of illustration, the techniques of the present disclosure are described in the context of biasing the N-wells of p-type transistors using the maximum voltage of the set of voltages as the extreme voltage. However, the illustrated example techniques can be modified using the teachings provided herein to bias the P-wells of n-type transistors using the minimum voltage of the set of voltages as the extreme voltage without departing from the scope of the present disclosure.

Figure 1:
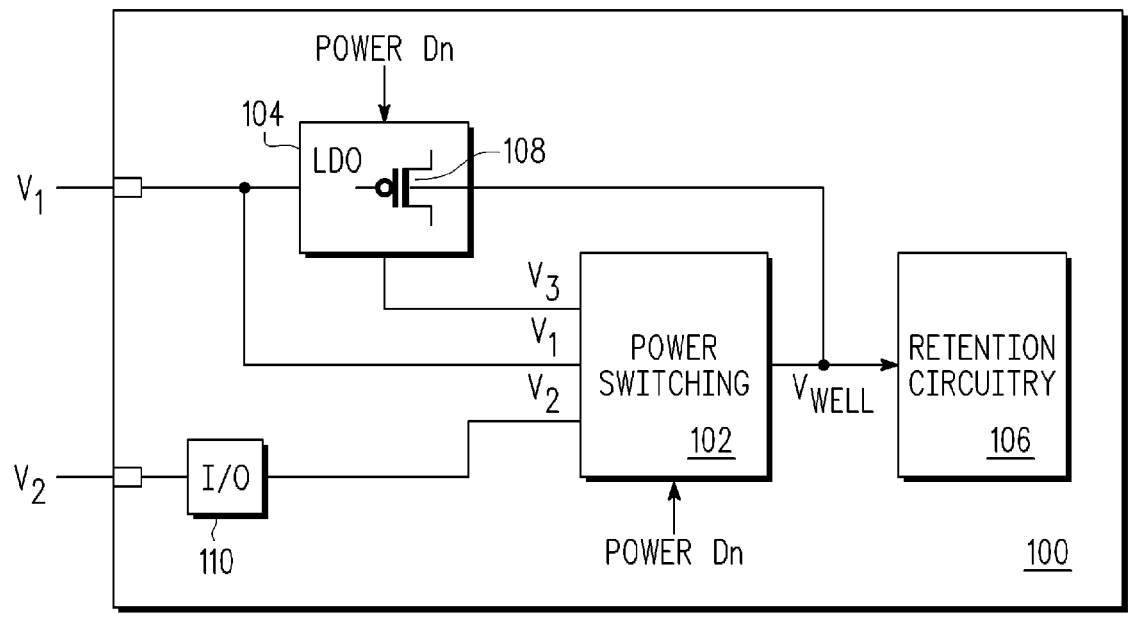
FIG. 1 is a diagram illustrating an electronic device comprising a power switching module for biasing the wells of one or more transistors with the extreme voltage of a set of three or more voltages in accordance with at least one embodiment of the present disclosure.

FIG. 1 illustrates an electronic device 100 configured to bias one or more transistor wells using the extreme voltage of a set of three or more voltages in accordance with at least one embodiment of the present disclosure. The electronic device 100 can be implemented as one or more integrated circuit packages, such as, for example, a system-on-a-chip. The electronic device 100 includes a power switching module 102, a voltage regulator 104 (e.g., a low dropout (LDO) regulator), and retention circuitry 106 (e.g., "keep alive" circuitry for low power modes). The power switching module 102 includes a plurality of inputs to receive a set of three or more voltages (voltages $V_1$, $V_2$, and $V_3$ in the example of FIG. 1) and an output to provide a voltage $V_{WELL}$, which is used to bias the wells of one or more transistors of the electronic device 100 so as to reduce or eliminate the occurrence of parasitic currents, reverse currents, or latch-up. To illustrate, the voltage regulator 104 can include a power transistor 108 (illustrated as a p-type field effect transistor (FET)) having an N-well that is biased by the voltage $V_{WELL}$ so as to prevent reverse currents and latch-up of the voltage regulator 104. Likewise, the voltage $V_{WELL}$ can be used to supply the retention circuitry 106 so that the logic content of the retention circuitry remains valid even when one or more of the voltages $V_1$, $V_2$ or $V_3$ are removed. Consequently, the wells of the p-type transistors of the retention circuitry 106 are biased by the voltage $V_{WELL}$ to reduce or eliminate reverse currents and latch-up. The voltage $V_{WELL}$ further can be used to power certain components of the electronic device 100 or power components external to the electronic device 100.

In the depicted example implementation, the voltage $V_1$ is received at the circuit device 100 from a source external to the circuit device 100, the voltage $V_2$ can be received from an internal source (e.g., an input/output (IO) segment 110 of the electronic device 100) or an external source, and the voltage $V_3$ is sourced by the voltage regulator 104 based on the voltage $V_1$. Further, the voltage regulator 104 can be shut down by grounding the voltage $V_1$ or otherwise reducing the voltage $V_1$ below a certain threshold. As it may be desirable to continue to power the retention circuitry 106 (at least in a low power state) even while the voltage $V_1$ is grounded, the voltage $V_2$ is supplied for at least the purposes of powering the retention circuitry 102, biasing the wells of transistors of the retention circuitry 102, or a combination thereof.

In one embodiment, the electronic device 100 is operable in at least two modes: a full-power/normal mode and a low power mode, whereby the mode can be signaled based on the state of a signal PowerDn. During the full-power/normal mode, the voltage $V_1$ is supplied to the voltage regulator 104 for generation of the voltage $V_3$, which can be provided to the retention circuitry 106 and other circuitry of the electronic device 100. During the low power mode, the voltage $V_1$ is grounded or dropped below a certain threshold so as to shut down the voltage regulator 104. Further, the voltage $V_2$ can be provided via the I/O segment 110 or other source so as to bias the wells of certain transistors of the electronic device 100, including the power transistor 108 and transistors of the retention circuitry 106.

In certain environments (e.g., an automotive implementation), it cannot be guaranteed that the voltages of the set of voltages will be raised or lowered relative to each other in a well-behaved and predetermined order when the electronic device 100 is to enter the low power mode. Thus, a fixed biasing of the wells of the power transistor 108 and other transistors of the electronic device 100 by the voltage $V_2$ can cause reverse and parasitic currents in those instances whereby the voltage $V_2$ is temporarily below voltage $V_1$ or voltage $V_3$ during the power-up or power-down sequences or during normal operating mode. Accordingly, in the p-type transistor example implementation of FIG. 1, when a low power mode is signaled via the PowerDn signal or via other indicia, the power switching module 102 is configured to provide the highest voltage of the set of voltages $V_1$, $V_2$, and $V_3$ as the voltage $V_{WELL}$ so that the wells of the power transistor 108 and the retention circuitry 106 are biased by the highest voltage of the set of voltages even as the voltages $V_1$, $V_2$, and $V_3$ change during the power-down sequence. By continually biasing the well of the power transistor 108 with whatever voltage of the voltages $V_1$, $V_2$, and $V_3$ is the highest at any given point during the low power mode, the likelihood and magnitude of latch-up or the generation of any reverse current at the power transistor 108 is reduced, thereby helping to prevent damage to the electronic device 100 due to the unpredictable order in which the voltages $V_1$, $V_2$, or $V_3$ change relative to each other. The biasing of wells of transistors of the retention circuitry 106 or other circuitry of the electronic device 100 can prevent damage or erratic behavior in a similar manner.

Figure 2:
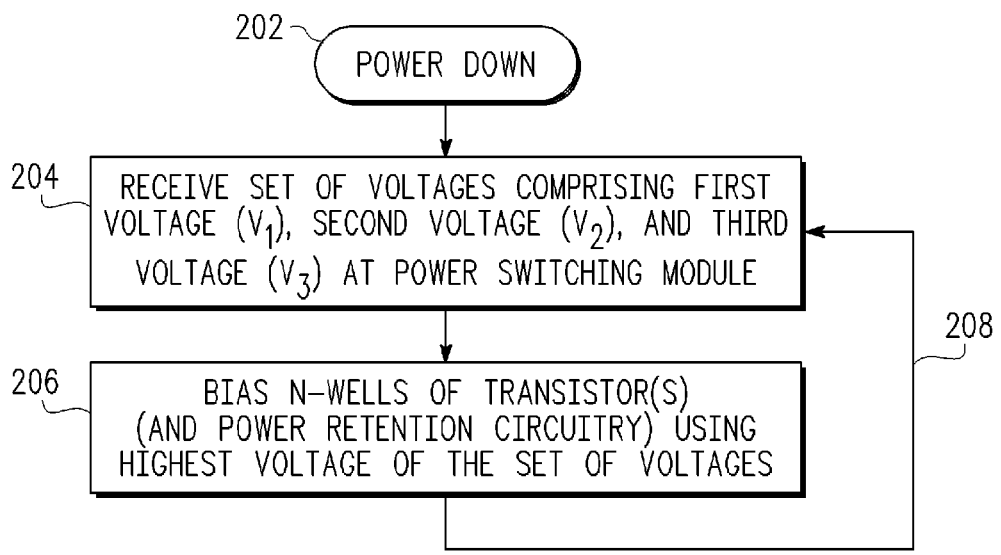
FIG. 2 is a flow diagram illustrating a method of operation of the power switching module of FIG. 1 in accordance with at least one embodiment of the present disclosure.

FIG. 2 illustrates an example method 200 of the operation of power switching module 102 of the electronic device 100 of FIG. 1 for entering a low power mode in accordance with at least one embodiment of the present disclosure. At block 202, an event (e.g., user manipulation of a power button, expiration of a timer, etc.) triggers the electronic device 100 to initiate a power-down sequence to enter a low power state and the PowerDn signal (FIG. 1) is configured to signal the power-down sequence. At block 204, the set of voltages $V_1$, $V_2$, and $V_3$ are received at the power switching module 102 from their respective sources. Note that although block 204 is illustrated as following block 202 for ease of illustration, it will be appreciated that, in at least one embodiment, the set of voltages $V_1$, $V_2$, and $V_3$ are continuously received at the power switching module 102 and it is the magnitudes of these voltages that vary over time depending on the particular operation and mode of the electronic device 100. Responsive to entering the power down sequence, the power switching module 102 continuously determines the highest voltage from the set of voltages $V_1$, $V_2$, and $V_3$ and continuously outputs the highest voltage at that given point in time as the voltage $V_{WELL}$ so as to bias the well of the power transistor 108 with the highest of the set of voltages. The voltage $V_{WELL}$ further can be provided to the retention circuitry 106 as either or both of a supply voltage and a well-biasing voltage so as to maintain the retention circuitry 106 in a low-power retention state. As represented by loop-back 208, the process of blocks 204 and 206 is a continuously updating process responsive to changes in the relative magnitudes of the set of voltages $V_1$, $V_2$, and $V_3$ such that the voltage $V_{WELL}$ output by the power switching module 102 at a given point in time reflects the highest of the voltages $V_1$, $V_2$, and $V_3$ for that given point in time (taking into consideration the delay introduced by the circuitry of the power-switching module 102). Thus, by continuously providing the highest voltage of the set of voltages to bias the wells of transistors of the electronic device 100 for the low power mode, the potential for latch-up, reverse currents, or other erratic behavior due to the particular sequence in which the voltages $V_1$, $V_2$, and $V_3$ rise or fall with respect to each other during the transition to the low power mode is reduced or eliminated.

Figure 3:
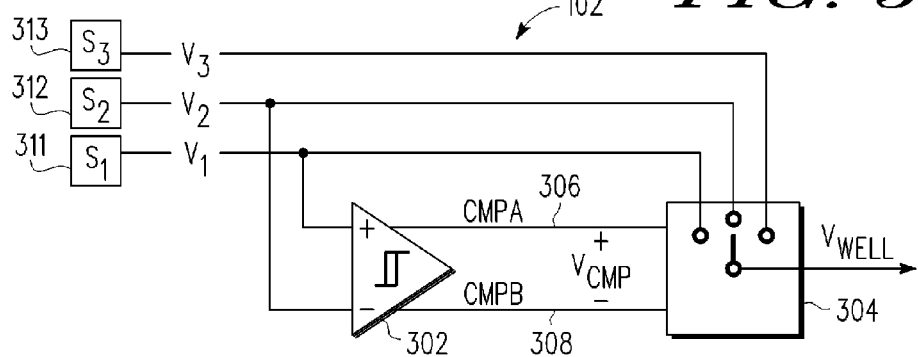
FIG. 3 is a diagram illustrating an example implementation of the power switching module of FIG. 1 in accordance with at least one embodiment of the present disclosure.

FIG. 3 illustrates a particular implementation of the power switching module 102 in accordance with at least one embodiment of the present disclosure. In the depicted example, the power-switching module 102 includes a comparator 302 and a switch circuit 304. The comparator 302 includes a first input coupled to the source 311 of the voltage $V_1$, a second input coupled to the source 312 of the voltage $V_2$, a first output to provide a signal CMPA (signal 306), and a second output to provide a signal CMPB (signal 308) concurrent with the signal CMPA, whereby the differential voltage between the signal CMPA and the signal CMPB is identified as voltage VCMP (VCMP=CMPA−CMPB). The switch circuit 304 includes a first input coupled to the source 311 to receive the voltage $V_1$, a second input coupled to the source 312 to receive the voltage $V_2$, a third input coupled to the source 313 to receive the voltage $V_3$, a fourth input to receive the signal CMPA, a fifth input to receive the signal CMPB, and an output to provide the voltage $V_{WELL}$.

The comparator 302 configures the signals CMPA and CMPB relative to each other (and thus configures the magnitude and polarity of the voltage VCMP) based on a comparison of the voltage $V_1$ and the voltage $V_2$. Particularly, in one embodiment, the comparator 302 configures the signals CMPA and CMPB such that the voltage VCMP is substantially equal to voltage $V_1$ (i.e., $V_{CMP}=V_1$ minus any voltage drop due to non-ideal operation of the circuitry of the comparator 302) responsive to the voltage $V_1$ being greater than voltage $V_2$. Conversely, in this embodiment, the comparator 302 configures the signals CMPA and CMPB such that the voltage VCMP is substantially equal to $-V_2$ (i.e., VCMP=$-V_2$ plus/minus any voltage drop due to non-ideal operation of the circuitry of the comparator 302). The comparator 302 can achieve this arrangement by, for example, driving the signal CMPA to substantially equal to the voltage $V_1$ and grounding the signal CMPB when the voltage $V_1$ is greater than $V_2$ or driving the signal CMPB to substantially equal to the voltage $V_2$ and grounding the signal CMPA when the voltage $V_2$ is greater than $V_1$. When the voltage $V_1$ and $V_2$ are equal, either may be used for the voltage $V_{WELL}$ (assuming the voltage $V_3$ is less than both) and thus it is not important as to whether the signals CMPA and CMPB are configured in the same manner as when the voltage $V_2$ is greater than the voltage $V_1$ or in the same manner as when the voltage $V_1$ is greater than the voltage $V_2$. In certain instances, there is a small window where the voltages $V_1$ and $V_2$ are slightly different, for example $V_1 > V_2$, and the comparator 302 might be configured in the opposite state, e.g., CMPB=voltage $V_2$, CMPA=ground (0) reference. As long as the difference $V_1 - V_2$ is smaller than the forward diode voltage and the threshold voltage of the power transistor 108, effectively no current will flow in power transistor 108, so neither reverse currents nor latch-up can occur. An example circuit-level implementation of the comparator 302 is illustrated in greater detail below with reference to FIG. 5.

The switch circuit 304, in one embodiment, is configured to selectively couple its output (which, in turn, is coupled or coupleable to the well of the power transistor 108, to transistors of the retention circuitry 106, etc.) to one of source 311, source 312, or source 313 based on the signals CMPA and CMPB from the comparator 302 and based on the voltage $V_3$ so as to provide the highest of the set of voltages $V_1$, $V_2$, and $V_3$ as the voltage $V_{WELL}$. An example implementation of the switch circuit 304 and its operation is described in greater detail below with reference to FIG. 6.

Figure 4:
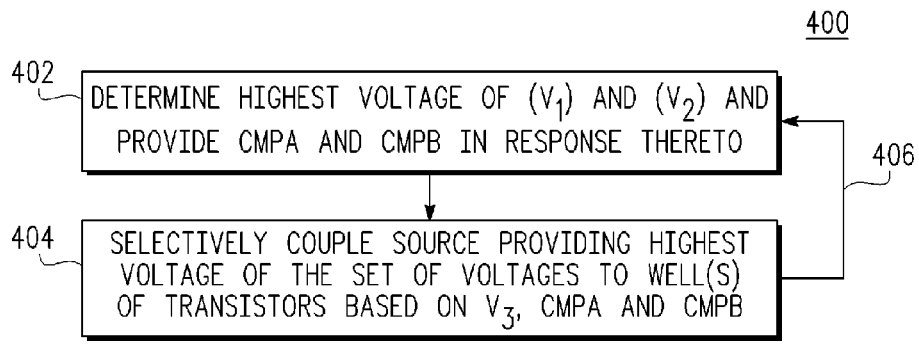
FIG. 4 is a flow diagram illustrating a method of operation of the implementation of the power switching module of FIG. 3 in accordance with at least one embodiment of the present disclosure.

FIG. 4 illustrates an example method 400 of the operation of the power switching module 102 of FIG. 3 for the low power mode in accordance with at least one embodiment of the present disclosure. At block 402, the comparator 302 compares the voltages $V_1$ and $V_2$ and configures the signals CMPA and CMPB based on this comparison as described above. At block 404, the switch circuit 304 selectively couples the source (of sources 311, 312, and 313) that is providing the highest voltage of the set of voltages $V_1$, $V_2$, and $V_3$ to the wells of the power transistor 108, and further to the wells and current-carrying electrodes of other transistors of the electronic device 100, so as to bias the well of the power transistor 108 and the other transistors with a voltage $V_{WELL}$ substantially equal to, or representative of, the highest voltage of the set. As described below, in at least one embodiment, the switch circuit 304 determines the highest voltage of the set based on the signals CMPA and CMPB provided by the comparator 302 and based on the voltage $V_3$.

Figure 5:
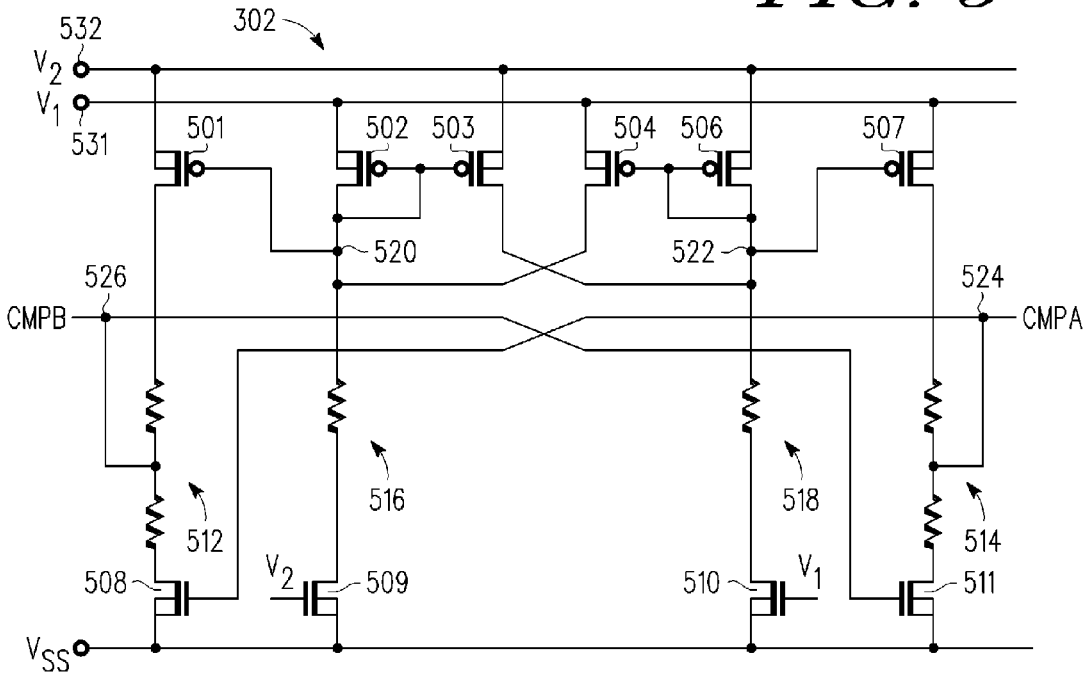
FIG. 5 is a circuit diagram illustrating an example implementation of a comparator of the power switching module of FIG. 3 in accordance with at least one embodiment of the present disclosure.

FIG. 5 illustrates an example circuit implementation of the comparator 302 of FIG. 3 in accordance with at least one embodiment of the present disclosure. In the depicted example, the comparator 302 includes p-type transistors 501-507 (illustrated as p-type FETs), n-type transistors 508-511 (illustrated as n-type FETs), input nodes 509 and 511, voltage dividers 512 and 514, and resistors 516 and 518. The node 509 is coupled to the source 311 (FIG. 3) of the voltage $V_1$ and the node 511 is coupled to the source 312 (FIG. 3) of voltage $V_2$. The transistor 501 includes a source electrode to receive the voltage $V_2$, a drain electrode coupled to a first terminal of the voltage divider 512, a gate electrode coupled to a node 520, and a well biased by the voltage $V_2$. The transistor 502 includes a source electrode to receive the voltage $V_1$, a drain electrode coupled to node 520, a gate electrode coupled to node 520, and a well biased by the voltage $V_1$. The transistor 503 includes a source electrode to receive the voltage $V_2$, a drain electrode coupled to a node 522, a gate electrode coupled to node 520, and a well biased by the voltage $V_2$. The transistor 504 includes a source electrode to receive the voltage $V_1$, a drain electrode coupled to the node 520, a gate electrode coupled to the node 522, and a well biased by the voltage $V_1$. The transistor 506 includes a source electrode to receive the voltage $V_2$, a drain electrode coupled to the node 522, a gate electrode coupled to the node 522, and a well biased by the voltage $V_2$. The transistor 507 includes a source electrode to receive the voltage $V_1$, a drain electrode coupled to a first terminal of the voltage divider 514, a gate electrode coupled to the node 522, and a well biased by the voltage $V_1$.

The transistor 508 includes a drain electrode coupled to a second terminal of the voltage divider 512, a source electrode coupled to a ground reference (e.g., Vss), a gate electrode coupled to a node 524, and a well biased by the ground reference. The transistor 509 includes a drain electrode coupled to a first terminal of the resistor 516, a source electrode coupled to a ground reference, a gate electrode to receive the voltage $V_2$, and a well biased by the ground reference. The transistor 510 includes a drain electrode coupled to a first terminal of the resistor 518, a source electrode coupled to the ground reference, a gate electrode to receive the voltage $V_1$, and a well biased by the ground reference. The transistor 511 includes a drain electrode coupled to a second terminal of the voltage divider 514, a source electrode coupled to the ground reference, a gate electrode coupled to a node 526, and a well biased by the ground reference.

The node 520 is further coupled to a second terminal of the resistor 516 and the node 522 is further coupled to a second terminal of the resistor 518. The node 524 is further coupled to a tap terminal of the voltage divider 514 and the node 526 is further coupled to a tap terminal of the voltage divider 512. The node 524 serves as the output of the comparator 302 that provides the signal CMPA and the node 526 serves as the output of the comparator 302 that provides the signal CMPB.

While every combination of the voltages $V_1$, $V_2$ and $V_3$ is possible in normal operation, there are three likely cases. One case is when the voltage $V_1$ is the highest voltage, the power transistor 108 is enabled (or "on") and regulating the voltage $V_3$, and the voltage $V_2$ is lower than the voltage $V_1$. A second case is when the voltage $V_2$ is the highest voltage, the voltage $V_1$ is grounded so that the power transistor 108 is disabled ("off") by the PowerDn signal, and the voltage $V_3$ is supplied from an external source. A third case is when the voltage $V_1$ and the voltage $V_2$ are at the same voltage, and the voltage regulator 104 is on. In this case, as the voltages $V_1$ and $V_2$ are equal, either the voltage $V_1$ or $V_2$ can be selected as the highest voltage by the comparator 302.

Figure 6:
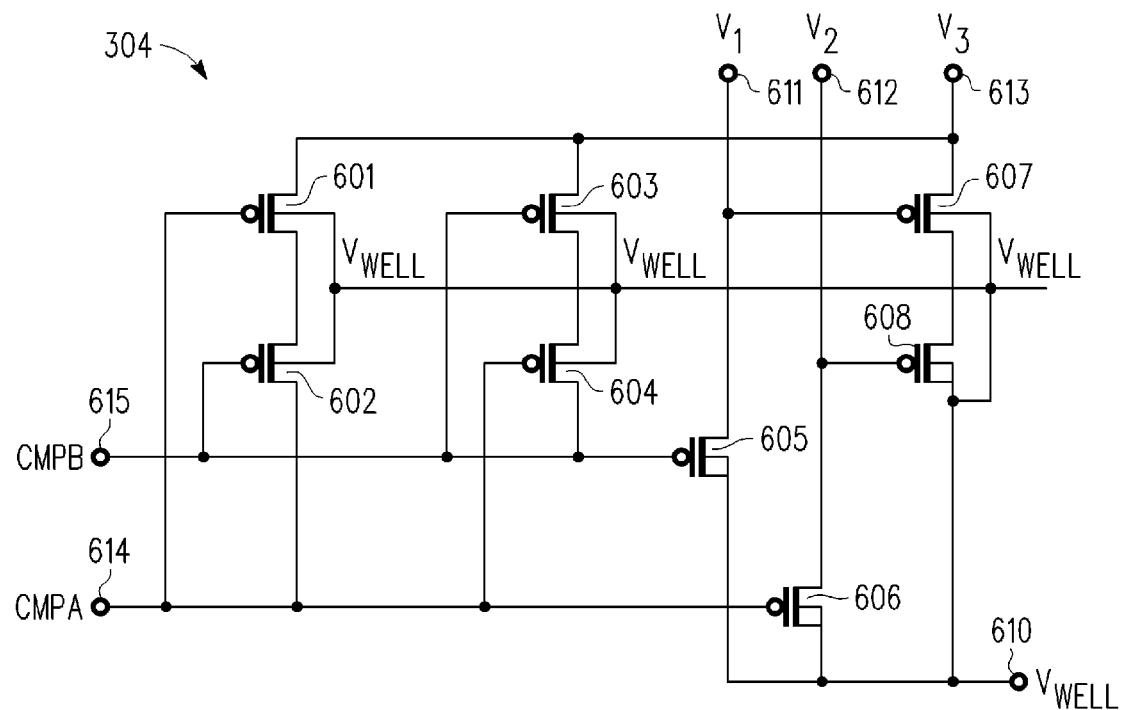
FIG. 6 is a circuit diagram illustrating an example implementation of a switch circuit of the power switching module of FIG. 3 in accordance with at least one embodiment of the present disclosure.

FIG. 6 illustrates an example circuit implementation of the switch circuit 304 of FIG. 3 in accordance with at least one embodiment of the present disclosure. In the depicted example, the switch circuit 304 includes p-type transistors 601-608 (illustrated as p-type FETS) and nodes 610, 611, 612, 613, 614, and 615. The node 610 serves as the output of the switch circuit 304 to provide the voltage $V_{WELL}$, the node 611 is coupled to the source of the voltage $V_1$, the node 612 is coupled to the source of the voltage $V_2$, the node 613 is coupled to the source of the voltage $V_3$, the node 614 is coupled to the first output of the comparator 302 (node 524, FIG. 5) to receive the signal CMPA, and the node 615 is coupled to the second output of the comparator 302 (node 526, FIG. 5) to receive the signal CMPB.

The transistor 601 includes a drain electrode coupled to the node 613, a source electrode, a gate electrode coupled to the node 614, and a well biased by the voltage $V_{WELL}$. The transistor 602 includes a source electrode coupled to the drain electrode of the transistor 601, a drain electrode coupled to the node 614, a gate electrode coupled to the node 615, and a well biased by the voltage $V_{WELL}$. The transistor 603 includes a source electrode coupled to the node 613, a drain electrode, a gate electrode coupled to the node 615, and a well biased by the voltage $V_{WELL}$. The transistor 604 includes a source electrode coupled to the drain electrode of the transistor 603, a drain electrode coupled to the node 615, a gate electrode coupled to the node 614, and a well biased by the voltage $V_{WELL}$. The transistor 605 includes a source electrode coupled to the node 611, a drain electrode coupled to the node 610, a gate electrode coupled to the node 615, and a well biased by the voltage $V_{WELL}$. The transistor 606 includes a source electrode coupled to the node 612, a drain electrode coupled to the node 610, a gate electrode coupled to the node 614, and a well biased by the voltage $V_{WELL}$. The transistor 607 includes a source electrode coupled to the node 613, a drain electrode, a gate electrode coupled to the node 611, and a well biased by the voltage $V_{WELL}$. The transistor 608 includes a source electrode coupled to the drain electrode of the transistor 607, a drain electrode coupled to the node 610, a gate electrode coupled to the node 612, and a well biased by the voltage $V_{WELL}$.

In operation, the signals CMPA and CMPB are received at nodes 614 and 615, respectively, from the comparator 302 (FIG. 3) based on a comparison of the voltage $V_1$ to the voltage $V_2$ as described above. The signal CMPA acts to control the transistor 606 as a switch and the signal CMPB acts to control the transistor 605 as a switch. As described with respect to FIG. 3, when voltage $V_1$ is higher than the voltage $V_2$, the comparator 302 configures the signal CMPA to be approximately equal to the voltage $V_1$ and configures the signal CMPB to be grounded (e.g., near 0 volts). In this circumstance, the transistor 605 is rendered conductive and the transistor 606 is rendered non-conductive, thereby coupling the node 611 (and thus the source 311, FIG. 3) to the node 610 so that the voltage $V_1$ is provided as the voltage $V_{WELL}$ unless the voltage $V_3$ is higher than the voltage $V_1$ (which is described below). Conversely, when the voltage $V_2$ is higher than the voltage $V_1$, the comparator configures the signal CMPB to be approximately equal to the voltage $V_2$ and configures the signal CMPA to be grounded, and thus the transistor 606 is rendered conductive and the transistor 605 is rendered non-conductive. This configuration results in the coupling of the node 612 (and thus the source 312, FIG. 3) to the node 610 so that the voltage $V_2$ is provided as the voltage $V_{WELL}$ unless the voltage $V_3$ is higher than the voltage $V_2$ (which is described below). Thus, in the event that the voltage $V_3$ is not the highest of the set of voltages $V_1$, $V_2$, and $V_3$, the signals CMPA and CMPB act to control the transistors 606 and 605, respectively, so as to selectively couple the source providing the highest of the voltages $V_1$ and $V_2$ to the node 610 for provision of the voltage $V_{WELL}$.

In the event that the voltage $V_3$ is higher than either the voltage $V_1$ or the voltage $V_2$, the stacked configuration of the transistors 601, 602, 603, and 604 will pull both signal CMPA and signal CMPB high (to approximately the voltage $V_3$), thereby rendering both of transistors 605 and 606 non-conductive. As will be appreciated from the configuration of the comparator 302 illustrated in FIG. 5, the outputs (nodes 524 and 526, FIG. 5) of the comparator 302 have a high impedance, which permits the switch circuit 304 to pull the outputs of the comparator 302 high without experiencing excessive current consumption based on current flow from the switch circuit 304 back into the comparator 302. With the transistors 605 and 606 rendered non-conductive in this circumstance, the node 610 is not coupled to either node 611 or 612 via the switch circuit 304. Concurrently, the transistors 607 and 608 are rendered conductive under these circumstances, thereby coupling the node 613 (and thus the source 313, FIG. 3) to the node 610 so as to provide the voltage $V_3$ as the voltage $V_{WELL}$.

It should be noted that in the implementation of FIG. 3, the switch circuit 304 does not include a transistor or other switch in series on the power rail (node 610) that provides the voltage $V_{WELL}$. Accordingly, the illustrated architecture can be readily scaled to accommodate a number of supply voltages greater than the illustrated example of three voltages using the guidelines provided herein.

Figure 7:
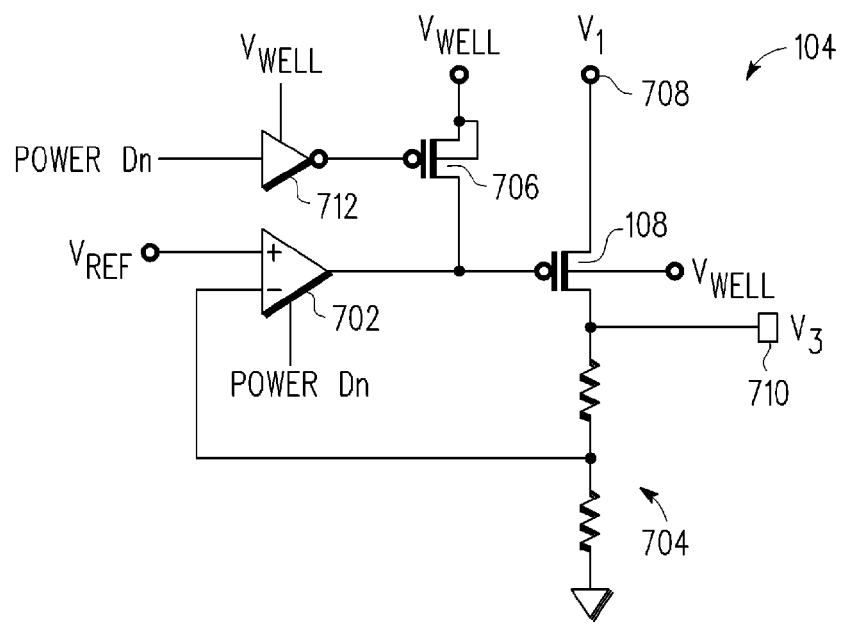
FIG. 7 is a circuit diagram illustrating an example implementation of a voltage regulator of the electronic device of FIG. 1 in accordance with at least one embodiment of the present disclosure.

FIG. 7 illustrates a particular implementation of the voltage regulator 104 of the electronic device 100 of FIG. 1 in accordance with at least one embodiment of the present disclosure. In the depicted example, the voltage regulator 104 includes the power transistor 108, a operational amplifier 702, a voltage divider 704, and a transistor 706 (illustrated as a p-type FET). The power transistor 108 (illustrated as a p-type FET) includes a source electrode coupled to a node 708 to receive the voltage $V_1$, a drain electrode coupled to a node 710 (which serves as the source 313 of the voltage $V_3$), a gate electrode, and a body (an n-well in this example) biased by the voltage $V_{WELL}$. The voltage divider 704 includes a first terminal coupled to the node 710, a second terminal coupled to a ground reference, and a tap terminal. The operational amplifier 702 includes a first input to receive a reference voltage VREF generated "on-chip" with a band-gap voltage or received from "off-chip", a second input coupled to the tap terminal of the voltage divider 704, and an output coupled to the gate electrode of the power transistor 108. The transistor 706 includes a source electrode coupled to the node 610 (FIG. 6) to receive the voltage $V_{WELL}$, a drain electrode coupled to the gate electrode of the power transistor 108, and a gate electrode to receive the output of an inverter 712 that is powered by the voltage $V_{WELL}$ and with an input to receive the signal PowerDn (FIG. 1).

In operation (in the example of FIG. 7), the voltage regulator 104 is active. The operational amplifier 702 compares the two input voltages VREF and the tap of the resistive ladder 704, driving the gate of the power transistor 108 to supply more or less current so that the voltage $V_3$ is a constant voltage (e.g., a multiple of VREF). The signal PowerDn is low, so that the gate of transistor 706 is pulled to the voltage $V_{WELL}$ by the inverter 712 and does not affect the operation of the voltage regulator 104.

When entering a low power mode, the PowerDn signal is asserted (driven high in the example of FIG. 7), and the inverter 712 pulls the gate of transistor 706 low, thereby causing the transistor 706 to pull the gate electrode of the power transistor 108 up to the voltage $V_{WELL}$ while also disabling the operational amplifier 702. At the same time, the well of the power transistor 108 is biased by the voltage $V_{WELL}$, thereby rendering the power transistor non-conductive, which can reduce or eliminate the potential for reverse currents through the transistor 108.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

What is claimed is:

1. An electronic device comprising:
a transistor; and
a power switching module comprising:
   a set of inputs, each input configured to receive a corresponding one of a set of voltages comprising at least a first voltage, a second voltage, and a third voltage; and
   an output coupled to a well of the transistor, the output configured to provide the extreme voltage of the set of voltages;
   a comparator comprising a first input to receive the first voltage, a second input to receive the second voltage, a first output to provide a first signal and a second output to provide a second signal, the comparator to configure the first signal and the second signal based on a comparison of the first voltage and the second voltage; and
   a switch circuit comprising a first input coupled to the first output of the comparator, a second input coupled to the second output of the comparator, and an output coupled to the output of the power switching module, the switch circuit configured to selectively couple the output of the power switching module to a source of the one of the first voltage, the second voltage or the third voltage based on first signal, the second signal, and the third voltage, and the switch circuit comprising:
      a first transistor comprising a gate electrode coupled to the first input, a source electrode coupled to a source of the third voltage, a drain electrode, and a body coupled to the output of the power switching module;
      a second transistor comprising a gate electrode coupled to the second input, a source electrode coupled to the drain electrode of the first transistor, a drain electrode coupled to the first input, and a body coupled to the output of the power switching module;
      a third transistor comprising a gate electrode coupled to the second input, a source electrode coupled to the source of the third voltage, a drain electrode, and a body coupled to the output of the power switching module;
      a fourth transistor comprising a gate electrode coupled to the first input, a source electrode coupled to the drain electrode of the third transistor, a drain electrode coupled to the second input, and a body coupled to the output of the power switching module;
      a fifth transistor comprising a gate electrode coupled to the second input, a source electrode coupled to a source of the first voltage, a drain electrode coupled to the output of the power switching module, and a body coupled to the output of the power switching module;
      a sixth transistor comprising a gate electrode coupled to the first input, a source electrode coupled to a source of the second voltage, a drain electrode coupled to the output of the power switching module, and a body coupled to the output of the power switching module;
      a seventh transistor comprising a gate electrode coupled to the source of the first voltage, a source electrode coupled to the source of the third voltage, a drain electrode, and a body coupled to the output of the power switching module; and
      an eighth transistor comprising a gate electrode coupled to the source of the second voltage, a source electrode coupled to the drain electrode of the seventh transistor, a drain electrode coupled to the output of the power switching module, and a body coupled to the output of the power switching module.

* * * * *